United States Patent
Wang et al.

(10) Patent No.: US 12,349,579 B2
(45) Date of Patent: Jul. 1, 2025

(54) DISPLAY SUBSTRATE AND DISPLAY APPARATUS

(71) Applicant: BOE Technology Group Co., Ltd., Beijing (CN)

(72) Inventors: Tao Wang, Beijing (CN); Chengjie Qin, Beijing (CN); Ziyu Zhang, Beijing (CN); Yue Cui, Beijing (CN); Tao Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 107 days.

(21) Appl. No.: 17/913,595

(22) PCT Filed: Oct. 22, 2021

(86) PCT No.: PCT/CN2021/125657
§ 371 (c)(1),
(2) Date: Sep. 22, 2022

(87) PCT Pub. No.: WO2022/222399
PCT Pub. Date: Oct. 27, 2022

(65) Prior Publication Data
US 2024/0224718 A1  Jul. 4, 2024

(30) Foreign Application Priority Data
Apr. 23, 2021 (CN) .......................... 202110445380.X

(51) Int. Cl.
*H10K 59/80* (2023.01)
(52) U.S. Cl.
CPC .................................. *H10K 59/873* (2023.02)
(58) Field of Classification Search
None
See application file for complete search history.

(56) References Cited

U.S. PATENT DOCUMENTS

| | | | |
|---|---|---|---|
| 10,186,683 B2 | 1/2019 | Jiang et al. | |
| 2015/0060806 A1* | 3/2015 | Park .................... | H10K 50/8428 257/40 |

(Continued)

FOREIGN PATENT DOCUMENTS

| | | |
|---|---|---|
| CN | 105093690 A | 11/2015 |
| CN | 105261712 A | 1/2016 |

(Continued)

OTHER PUBLICATIONS

Office Action dated Apr. 28, 2022, issued in counterpart CN application No. 202110445380.X, with English translation. (12 pages).

(Continued)

*Primary Examiner* — Kyoung Lee
(74) *Attorney, Agent, or Firm* — WHDA, LLP

(57) ABSTRACT

A display substrate is provided. The display substrate includes: a substrate; a light emitting layer arranged on a side of the substrate; an encapsulation layer arranged on a side of the light emitting layer away from the substrate; and at least two dams arranged around a display area in a non-display area. The encapsulation layer includes an organic material layer, and the dams include a first dam arranged around the display area and a second dam arranged around the first dam, where the first dam includes a first sub-dam arranged discontinuously, a second sub-dam arranged continuously, and at least one third sub-dam connecting the first sub-dam and the second sub-dam; the first sub-dam, the second sub-dam, and the third sub-dam are arranged around to form at least one semi-closed region structure; and at least a part of the organic material layer is located in the semi-closed region structure.

18 Claims, 9 Drawing Sheets

(56) References Cited

U.S. PATENT DOCUMENTS

| | | | |
|---|---|---|---|
| 2016/0035996 A1 | 2/2016 | Sun et al. |
| 2017/0062534 A1 | 3/2017 | Jiang et al. |
| 2022/0115624 A1 | 4/2022 | Wang |

FOREIGN PATENT DOCUMENTS

| | | | |
|---|---|---|---|
| CN | 107170792 A | 9/2017 |
| CN | 107195803 A | 9/2017 |
| CN | 109557725 A | 4/2019 |
| CN | 209842296 U | 12/2019 |
| CN | 111653589 A | 9/2020 |
| CN | 113178536 A | 7/2021 |

OTHER PUBLICATIONS

International Search Report dated Dec. 24, 2021, issued in counterpart International application No. PCT/CN2021/125657, with English translation. (6 pages).
Written Opinion dated Dec. 24, 2021, issued in counterpart International application No. PCT/CN2021/125657. (4 pages).

\* cited by examiner

23

23'

DISPLAY SUBSTRATE AND DISPLAY APPARATUS

CROSS-REFERENCE TO RELATED APPLICATION

This application is a Section 371 National Stage Application of International Application No. PCT/CN2021/125657, filed on Oct. 22, 2021, which claims priority to Chinese Patent Application No. 202110445380.X, filed on Apr. 23, 2021, and the disclosures of which are incorporated herein by reference in their entirety.

TECHNICAL FIELD

The present disclosure relates to a field of display technology, in particular to a display substrate and a display apparatus.

BACKGROUND

An organic light-emitting diode (OLED) needs to be encapsulated after a light emitting element is formed, so as to prevent water vapor, oxygen and other external substances from penetrating into the light emitting element and causing a chemical reaction with a cathode metal in the light emitting element, which may result in an OLED failure.

In a related art, during an encapsulation process, in order to control an overflow of an organic material solution in a process of forming an encapsulation layer and prevent an organic layer from exceeding a protection region of an inorganic layer, a sufficient space is reserved in a non-display area so that a boundary of the organic material solution may be located within the protection region of the inorganic layer. Such method may lead to a large boundary of the non-display area, which may not meet a narrow bezel design requirement of a display screen. Therefore, in a production of OLEDs, how to reduce the boundary of the non-display area while ensuring a good encapsulation effect of the encapsulation layer has become an important topic for researchers.

The above information disclosed in this section is only for the understanding of the background of a technical concept of the present disclosure. Therefore, the above information may contain information that does not constitute a related art.

SUMMARY

In an aspect, a display substrate including a display area and a non-display area around the display area is provided, the display substrate includes: a substrate; a light emitting layer arranged on a side of the substrate; an encapsulation layer arranged on a side of the light emitting layer away from the substrate and configured to encapsulate the light emitting layer; and at least two dams arranged around the display area in the non-display area. The encapsulation layer includes an organic material layer, and the dams include a first dam arranged around the display area and a second dam arranged around the first dam, where the first dam includes a first sub-dam arranged discontinuously, a second sub-dam arranged continuously, and at least one third sub-dam connecting the first sub-dam and the second sub-dam; the first sub-dam, the second sub-dam, and the third sub-dam are arranged around to form at least one semi-closed region structure; and at least a part of the organic material layer is located in the semi-closed region structure.

According to exemplary embodiments, the semi-closed region structure has an opening facing the display area, and at least a part of the organic material layer is located in the opening.

According to exemplary embodiments, a width of the opening on a side proximate to the display area is greater than a width of the opening on a side away from the display area.

According to exemplary embodiments, the width of the opening on the side away from the display area is in a range of 8 μm to 12 μm.

According to exemplary embodiments, a width of the first sub-dam, a width of the second sub-dam, and a width of the third sub-dam are in a range of 20 μm to 80 μm.

According to exemplary embodiments, a height of the first sub-dam is less than or equal to a height of the second sub-dam; and a height of the third sub-dam is less than or equal to the height of the first sub-dam.

According to exemplary embodiments, the height of the first sub-dam, the height of the second sub-dam, and the height of the third sub-dam are in a range of 0.5 μm to 2 μm.

According to exemplary embodiments, two or more third sub-dams are provided, and a distance between adjacent third sub-dams is in a range of 5 mm to 15 mm.

According to exemplary embodiments, at least one of the first sub-dam, the second sub-dam, or the third sub-dam is provided with a stepped structure.

According to exemplary embodiments, a stepped structure of the first sub-dam is arranged on a side surface of the first sub-dam facing the display area; and/or a stepped structure of the second sub-dam is arranged on a side surface of the second sub-dam facing the display area.

According to exemplary embodiments, the first dam and the second dam include a first material layer, and each of the first dam and the second dam includes a first part; and the first part of the first dam and the first part of the second dam are located in the first material layer.

According to exemplary embodiments, the first dam and the second dam further include a second material layer, and each of the first dam and the second dam further includes a second part; and the second part of the second sub-dam and the second part of the second dam are located in the second material layer.

According to exemplary embodiments, a pixel definition layer is formed of a material included in the first material layer, and a spacer is formed of a material included in the second material layer.

According to exemplary embodiments, the second dam further includes a third material layer, and a planarization layer is formed of a material included in the third material layer.

According to exemplary embodiments, a third dam around the display area is further provided on a side of the first dam proximate to the display area, and a planarization layer is formed of a material included in the third dam.

According to exemplary embodiments, the at least two dams are arranged on a side of the substrate; the display substrate further includes a power line arranged between the substrate and the at least two dams; and an orthographic projection of the first dam on the substrate overlaps with an orthographic projection of the power line on the substrate.

According to exemplary embodiments, the display substrate further includes an anode transfer layer arranged between the power line and the at least two dams; the display substrate further includes a cathode arranged on the side of the light emitting layer away from the substrate; and the anode transfer layer is electrically connected to the power line and the cathode.

In another aspect, a display apparatus including the display substrate described above is provided.

BRIEF DESCRIPTION OF THE DRAWINGS

In order to illustrate the technical solutions in embodiments of the present disclosure more clearly, the drawings of embodiments will be briefly introduced below. It should be noted that the drawings described below only relate to some embodiments of the present disclosure, rather than a limitation to the present disclosure.

DETAILED DESCRIPTION OF EMBODIMENTS

Figure 1:
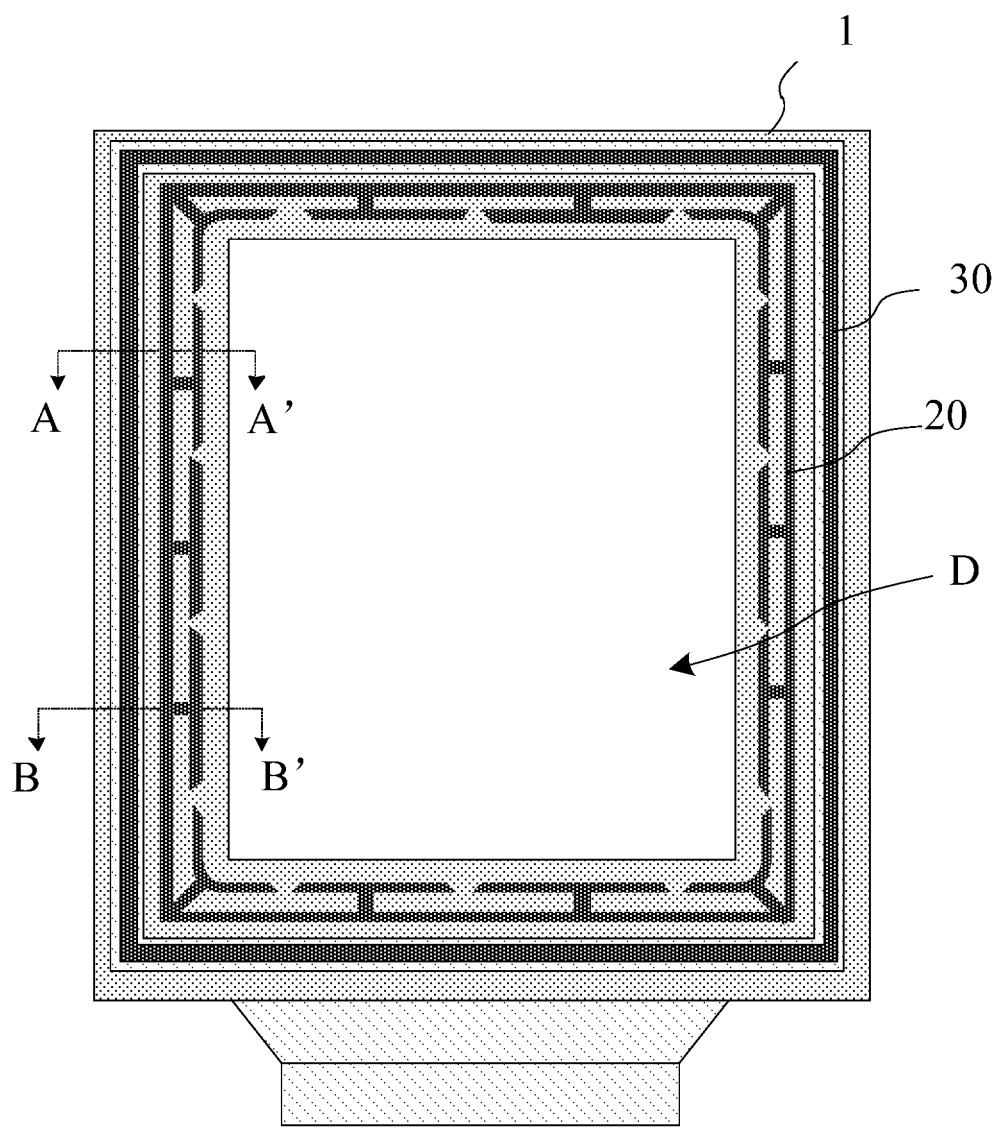
FIG. 1 shows a top view of a structure of a display substrate according to exemplary embodiments of the present disclosure.

In order to make objectives, technical solutions and advantages of the present disclosure clearer, the technical solutions of embodiments of the present disclosure will be clearly and completely described below with reference to the drawings. Obviously, the described embodiments are only part of embodiments of the present disclosure, rather than all embodiments. Based on the described embodiments of the present disclosure, all additional embodiments obtained by those ordinary skilled in the art without carrying out inventive effort fall within the scope of protection of the present disclosure.

It should be noted that, in the drawings, for clarity and/or description purposes, size and relative size of elements may be enlarged. Accordingly, the size and relative size of each element need not to be limited to those shown in the drawings. In the specification and drawings, the same or similar reference numerals indicate the same or similar components.

When an element is described as being "on", "connected to" or "coupled to" another element, the element may be directly on the other element, directly connected to the other element, or directly coupled to the other element, or an intermediate element may be provided. However, when an element is described as being "directly on", "directly connected to" or "directly coupled to" another element, no intermediate element is provided. Other terms and/or expressions used to describe a relationship between elements, such as "between" and "directly between", "adjacent to" and "directly adjacent to", "on" and "directly on", and so on, should be interpreted in a similar manner. In addition, the term "connection" may refer to a physical connection, an electrical connection, a communicative connection, and/or a fluid connection. In addition, X-axis, Y-axis and Z-axis are not limited to three axes of a rectangular coordinate system, and may be interpreted in a broader meaning. For example, the X-axis, the Y-axis and the Z-axis may be perpendicular to each other, or may represent different directions that are not perpendicular to each other. For the objective of the present disclosure, "at least one of X, Y or Z" and "at least one selected from a group consisting of X, Y and Z" may be interpreted as only X, only Y, only Z, or any combination of two or more of X, Y and Z, such as XYZ, XYY, YZ and ZZ. As used herein, the term "and/or" includes any and all combinations of one or more of the listed related items.

It should be noted that although the terms "first", "second", and the like may be used herein to describe various components, members, elements, regions, layers and/or parts, these components, members, elements, regions, layers and/or parts should not be limited by these terms. Rather, these terms are used to distinguish one component, member, element, region, layer and/or part from another. Therefore, for example, a first component, a first member, a first element, a first region, a first layer and/or a first part discussed below may be referred to as a second component, a second member, a second element, a second region, a second layer and/or a second part without departing from teachings of the present disclosure.

For ease of description, spatial relationship terms, such as "upper", "lower", "left", "right", may be used herein to describe a relationship between one element or feature and another element or feature as shown in the figure. It should be understood that the spatial relationship terms are intended to cover other different orientations of a device in use or operation in addition to the orientation described in the figure. For example, if the device in the figure is turned upside down, an element or feature described as "below" or "under" another element or feature will be oriented "above" or "on" the other element or feature.

It should be noted that the expression "semi-closed region structure" herein may mean that in a region surrounded by a peripheral wall, there is an opening on the peripheral wall, so that an inside of the region may communicate with an outside of the region through the opening. The semi-closed region structure may be a square region, an annular region, a regular pattern region, or an irregular pattern region. The semi-closed region structure may form a space to accommodate other materials.

The expression "leveling region" may refer to a region in which an organic solution has a thickness decreasing from a predetermined thickness to zero in a curing process during a formation of an organic material layer, when an OLED device is encapsulated. That is, "leveling region" is a region of the organic material layer having a thickness that changes from a predetermined thickness to zero as the region is extending.

The expression "stepped structure" may refer to a formed step-shaped structure, which may be a plurality of steps formed by planes in horizontal and vertical directions, and the stepped structure may have a very small size, for example, micrometer level.

FIG. 1 shows a top view of a structure of a display substrate according to exemplary embodiments of the present disclosure.

Figure 2:
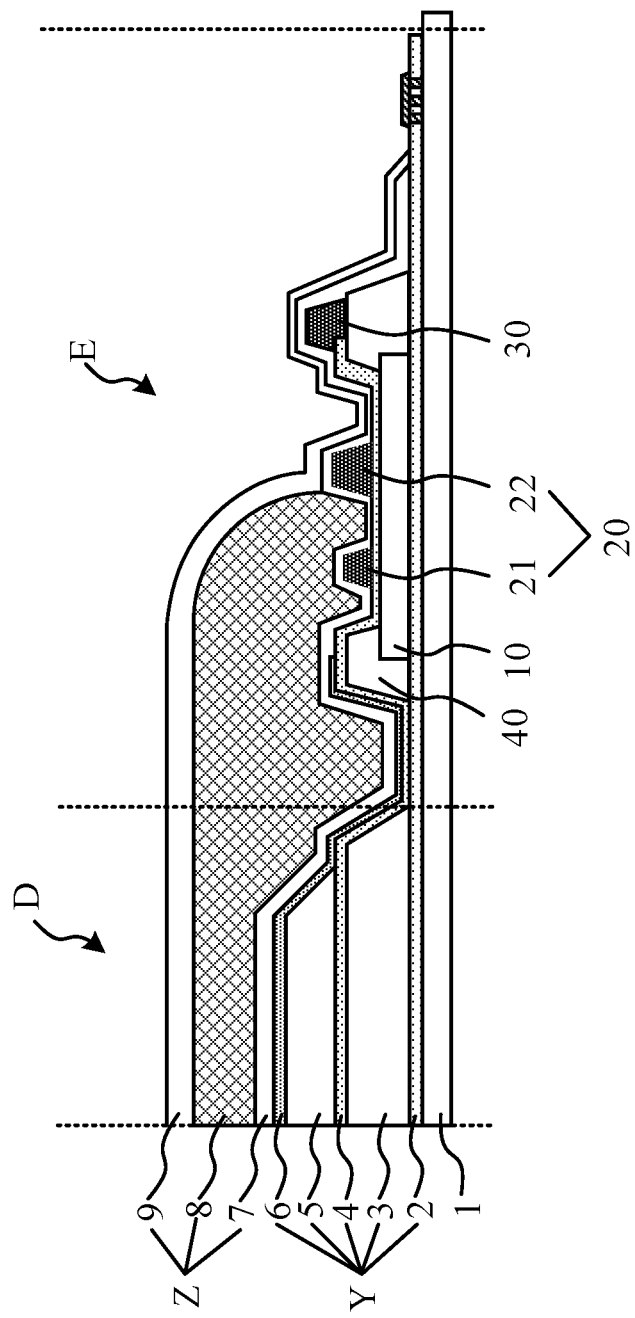
FIG. 2 shows a schematic diagram of a sectional structure of a display substrate taken along line AA' in FIG. 1, according to exemplary embodiments of the present disclosure.

FIG. 2 shows a schematic diagram of a sectional structure of a display substrate taken along line AA' in FIG. 1, according to exemplary embodiments of the present disclosure.

As shown in FIG. 1 and FIG. 2, the display substrate includes a display area D and a non-display area E surrounding the display area D. The display substrate includes a substrate 1, a light emitting layer Y, an encapsulation layer Z, and at least two dams arranged around the display area D in the non-display area E. The light emitting layer Y is arranged on a side of the substrate 1, and the encapsulation layer Z is arranged on a side of the light emitting layer away from the substrate 1. The encapsulation layer is used to encapsulate the light emitting layer Y The dams include a first dam 20 arranged around the display area D and a second dam 30 arranged around the first dam 20.

In an embodiment of the present disclosure, the substrate 1 includes, for example, a glass substrate, a flexible substrate, and the like. The light emitting layer Y includes, for example, an insulation layer 2, a planarization layer 3, an anode transfer layer 4, a pixel definition layer 5, an organic light emitting layer 6, and the like. The encapsulation layer Z may include film layers formed by alternately arranged inorganic layers and organic material layers, such as a first inorganic layer 7, an organic material layer 8, and a second inorganic layer 9.

In an embodiment of the present disclosure, the first dam 20 and the second dam 30 are both arranged in the non-display area E, and the first dam 20 is arranged on a side of a power line 10 away from the substrate 1.

Figure 3:
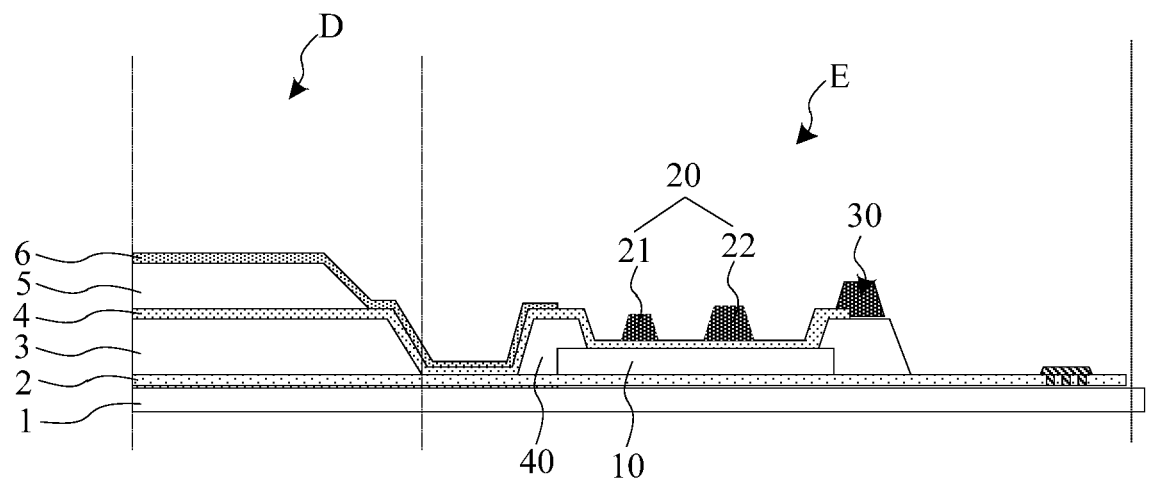
FIG. 3 shows a schematic diagram of a sectional structure of a display substrate without an encapsulation layer, taken along line AA' in FIG. 1, according to exemplary embodiments of the present disclosure.
Figure 4:
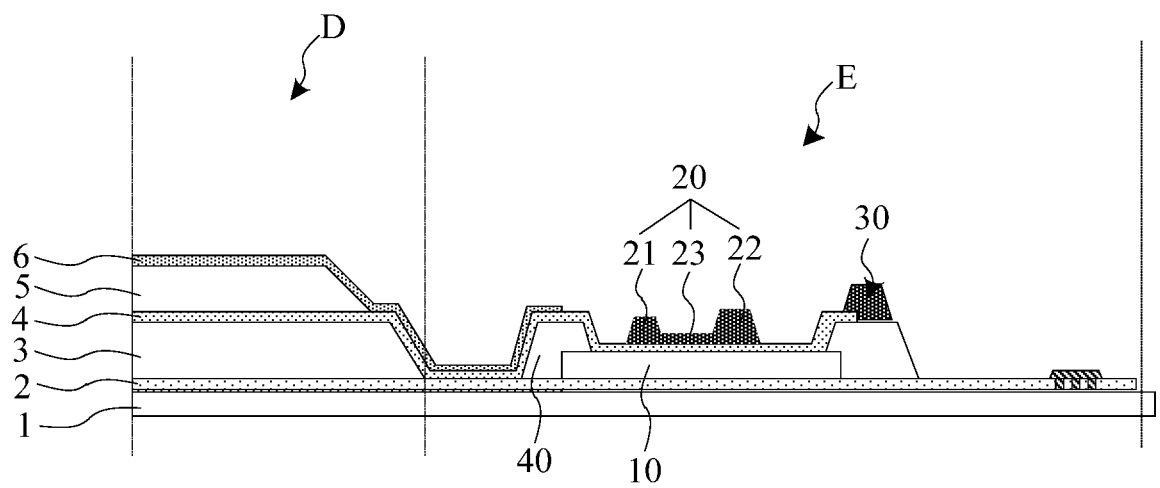
FIG. 4 shows a schematic diagram of a sectional structure of a display substrate without an encapsulation layer, taken along line BB' in FIG. 1, according to exemplary embodiments of the present disclosure.
Figure 5:
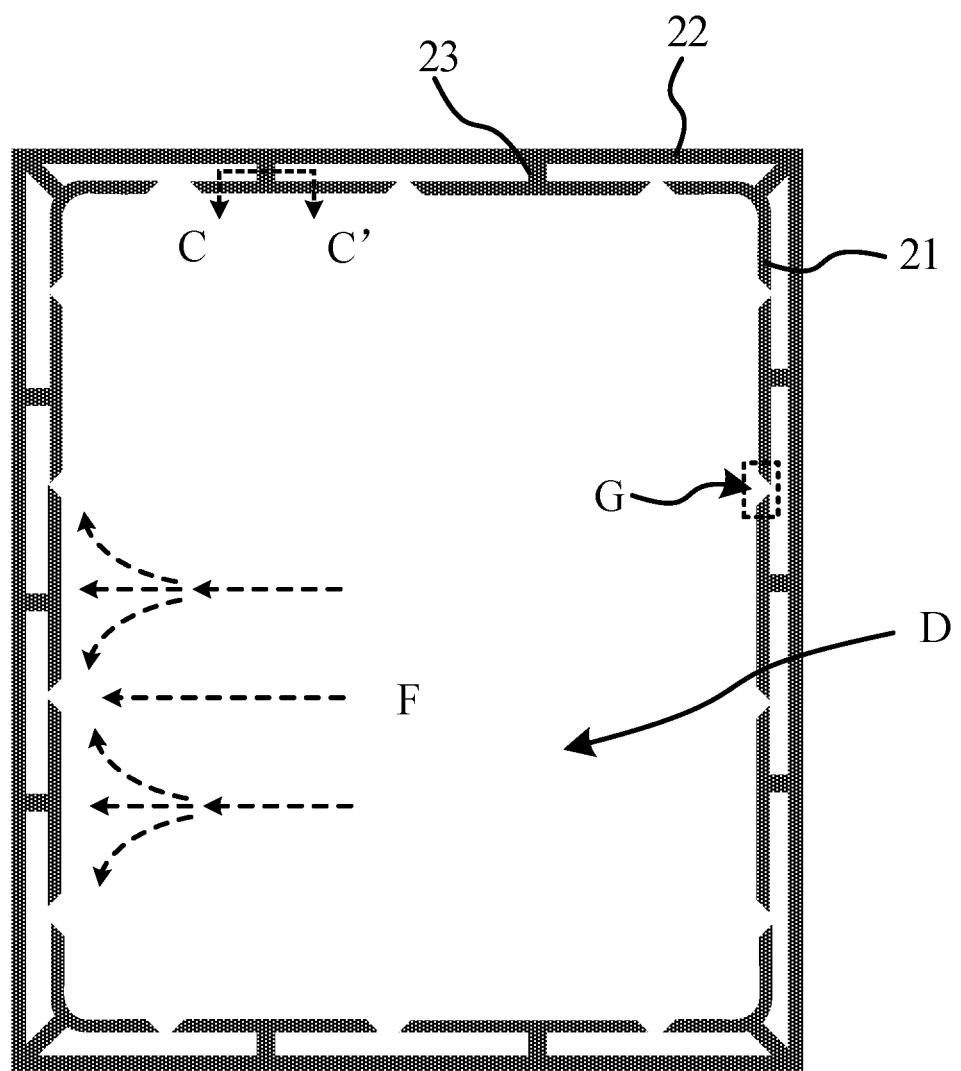
FIG. 5 shows a top view of a first dam of a display substrate according to exemplary embodiments of the present disclosure.

FIG. 3 shows a schematic diagram of a sectional structure of a display substrate without an encapsulation layer, taken along line AA' in FIG. 1, according to exemplary embodiments of the present disclosure. FIG. 4 shows a schematic diagram of a sectional structure of a display substrate without an encapsulation layer, taken along line BB' in FIG. 1, according to exemplary embodiments of the present disclosure. FIG. 5 shows a top view of a first dam of a display substrate according to exemplary embodiments of the present disclosure.

As shown in FIG. 3 to FIG. 5, the first dam 20 includes a first sub-dam 21 arranged discontinuously, a second sub-dam 22 arranged continuously, and at least one third sub-dam 23 connecting the first sub-dam 21 and the second sub-dam 22. The third sub-dam 23 may include, for example, one, two or, more third sub-dams 23. The first sub-dam 21 is discontinuously arranged to form a discontinuous frame-shaped structure around the display area D. The second sub-dam 22 is arranged around the first sub-dam 21 to form a rectangular frame structure. The third sub-dam 23 is arranged between the first sub-dam 21 and the second sub-dam 22, so that the first sub-dam 21, the second sub-dam 22, and the third sub-dam 23 are arranged around to form at least one semi-closed region structure. The at least one semi-closed region structure may include, for example, one, two, or more semi-closed region structures, and the number of the semi-closed region structure(s) may be adjusted according to actual production needs. The semi-closed region structure has an opening G, and a peripheral wall of the semi-closed region structure is C-shaped, as shown in FIG. 5. At least a part of the organic material layer 8 is located within the semi-closed region structure, as shown in FIG. 2.

The OLED light emitting layer of the display substrate is very sensitive to water vapor and oxygen, and penetrating of the water vapor and oxygen inside a device into the light emitting layer is a main factor affecting a life of the OLED device. Therefore, encapsulation is very important for the OLED device. The film layers formed by alternately arranged inorganic layers and organic material layers are used in the encapsulation, so as to encapsulate the OLED light emitting layer.

In the actual encapsulation process, after the first inorganic layer 7 is formed, the organic material layer 8 is formed on the first inorganic layer 7 by using a method of inkjet printing. Specifically, a liquid organic material is firstly printed in a predetermined region, such as the display area D and part of the non-display area E, and then the printed liquid organic solution is cured. Due to a surface energy and a material cohesion, a leveling region may exist at an edge of the organic solution, that is, a film thickness of the organic material layer may gradually decrease from a predetermined target thickness to 0 in the leveling region. A size of the leveling region is greatly affected by the surface energy and is difficult to be controlled accurately.

In order to control an overflow of the organic material layer 8 during the formation process and prevent the organic material layer from going beyond a protection region of the first inorganic layer 7 and the second inorganic layer 9, a dam structure may be provided to block the organic material layer 8. In the related art, influenced by the fluid mechanics of the organic material, after the organic material solution fully contacts the dam, a siphon phenomenon may occur on a side of the dam away from the display area D, so that the organic solution may pass over the dam and go beyond the protection region of the first inorganic layer 7 and the second inorganic layer 9, which may result in a poor encapsulation effect and a shortened service life of the display substrate.

In this regard, an embodiment of the present disclosure may be implemented to effectively restrain the overflow of the organic solution at the first dam 20 during the formation of the organic material layer 8 by providing the first dam 20 surrounding the display area D as a structure including the first sub-dam 21, the second sub-dam 22, and the third sub-dam 23.

As shown in FIG. 2 or FIG. 5, the first sub-dam 21 is near the display area D. When the organic material layer 8 is formed, the organic solution is blocked after flowing to the first sub-dam 21, as shown by a flow direction F in FIG. 5.

As the first sub-dam 21 is arranged discontinuously, the organic solution may be free from being blocked when flowing to a gap region, namely the opening of the semi-closed region structure, and thus enters a region between the first sub-dam 21 and the second sub-dam 22. The organic solution entering the region between the first sub-dam 21 and the second sub-dam 22 also has a buffering effect on the organic solution passing over the first sub-dam 21.

According to the embodiments of the present disclosure, by arranging the first dam 20 as a structure including the first sub-dam 21, the second sub-dam 22, and the third sub-dam 23 that are arranged around to form the at least one semi-closed region structure, the organic solution may be confined in the semi-closed region structure when passing the semi-closed region structure during the formation process of the organic material layer 8.

For example, the first sub-dam 21 and the second sub-dam 22 are arranged parallel to each other, the third sub-dam 23 is connected between the first sub-dam 21 and the second sub-dam 22, and the third sub-dam 23 is arranged perpendicular to the first sub-dam 21 and the second sub-dam 22, so that the semi-closed region structure is formed as a rectangular structure with an opening. In the process of forming the organic material layer 8 from the organic solution, the first sub-dam 21, the second sub-dam 22, and the third sub-dam 23 may facilitate an infiltration and diffusion of the organic solution in the formation of the organic material layer 8, so that the organic material layer 8 is confined within the semi-closed region structure. In this way, a cut-off position of the organic solution may be controlled accurately, and the leveling region of the organic solution may be narrower than the leveling region in the related art, which is beneficial to a narrow bezel design of the display substrate.

In an embodiment of the present disclosure, a width of the first sub-dam 21, a width of the second sub-dam 22, and a width of the third sub-dam 23 are set in a range of 20 μm to 80 μm. The width of the first sub-dam 21, the width of the second sub-dam 22, and the width of the third sub-dam 23 refer to a width perpendicular to a lengthwise direction of the first sub-dam 21, a width perpendicular to a lengthwise direction of the second sub-dam 22, and a width perpendicular to a lengthwise direction of the third sub-dam 23. The width of the first sub-dam 21, the width of the second sub-dam 22, and the width of the third sub-dam 23 may be the same or different.

For example, each of the width of the first sub-dam 21, the width of the second sub-dam 22, and the width of the third sub-dam 23 may be 20 μm, 40 μm, 60 μm, or 80 μm, or may be other suitable sizes. A specific width may be set according to actual needs.

For another example, the width of the first sub-dam 21 may be less than the width of the second sub-dam 22, so that the organic solution may easily pass over the first sub-dam 21 and enter the semi-closed region structure. As the second sub-dam 22 is set to be wider than the first sub-dam 22, it is difficult for the organic solution to pass over the second sub-dam 22, so that the organic solution may be confined in the semi-closed region structure, and at least a part of the finally formed organic material layer 8 is located in the semi-closed region structure. By forming the semi-closed region structure, a position of a boundary of the organic material layer formed by the organic solution may be precisely controlled.

In an optional embodiment, the width of the third sub-dam 23 may be equal to the width of the first sub-dam 21 or the width of the second sub-dam 22.

For example, the width of the third sub-dam 23 may be equal to the width of the first sub-dam 21. After fully filling a semi-closed region structure, the organic solution may fill an adjacent semi-closed region structure that has not been fully filled with the organic solution. With this arrangement, it may be ensured that the organic solution forms a uniform organic material layer in the non-display area.

In an embodiment of the present disclosure, a height of the first sub-dam 21 may be less than or equal to a height of the second sub-dam 22, and a height of the third sub-dam 23 may be less than or equal to the height of the first sub-dam 21. By setting different heights of the sub-dams, a blocking effect on the organic solution forming the organic material layer may be achieved.

For example, the height of the first sub-dam 21 may be less than the height of the second sub-dam 22. The first sub-dam 21 may pre-block the organic solution. After the organic solution passes over the first sub-dam 21, the second sub-dam with a greater height than the first sub-dam may achieve a more excellent blocking effect, so as to block the organic solution to be within the semi-closed region structure formed by the first dam 20, so that the finally formed organic material layer may be within the semi-closed region structure.

In an embodiment of the present disclosure, the height of the first sub-dam 21, the height of the second sub-dam 22, and the height of the third sub-dam 23 may be in a range of 0.5 μm to 2 μm, such as 0.5 μm, 1 μm, or 2 μm.

For example, the height of the first sub-dam 21, the height of the second sub-dam 22, and the height of the third sub-dam 23 may be the same or different.

In an embodiment of the present disclosure, two or more third sub-dams 23 may be provided, and a distance between adjacent third sub-dams 23 is in a range of 5 mm to 15 mm.

The first sub-dam 21 and the second sub-dam 22 are connect by the plurality of third sub-dams 23 to form a plurality of semi-closed region structures, and two adjacent third sub-dams 23 serve as opposite side walls of the semi-closed region structure. The distance between two adjacent third sub-dams 23 is set in a range of 5 mm to 15 mm, such as 5 mm, 10 mm, or 15 mm. By setting the distance, it is ensured that the semi-closed region may accommodate a certain volume of organic solution, so as to achieve a better encapsulation effect.

Figure 6:
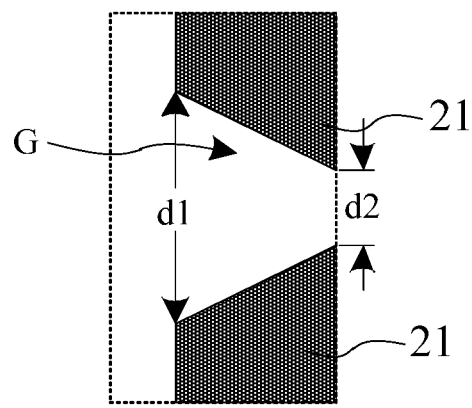
FIG. 6 shows a partial enlarged view of a first dam of a display substrate according to exemplary embodiments of the present disclosure.

FIG. 6 shows a partial enlarged view of the first dam of the display substrate according to exemplary embodiments of the present disclosure.

As shown in FIG. 6, the first sub-dam 21 of the first dam 20 is discontinuously arranged, and the formed semi-closed region structure has a plurality of openings G facing the display area D. During the formation of the organic material layer 8, the organic solution enters the semi-closed region structure through the opening G. The organic material layer is formed by curing the organic solution, so that at least a part of the organic material layer 8 is in the openings G.

For example, a plurality of openings G may be provided, and a part of the organic material layer 8 may partially fill some of the openings G, or a part of the organic material layer 8 may fill all the openings G.

In an embodiment of the present disclosure, as shown in FIG. 6, a width d1 of the opening G on a side proximate to the display area D is greater than a width d2 of the opening G on a side away from the display area D.

For example, a section of the opening G may be in a shape of an isosceles trapezoid, and a three-dimensional shape of the opening G may be a cone shape, a pyramid shape, or the like.

In other optional embodiments, the section of the opening may be in an irregular shape, the width d1 of the opening on the side proximate to the display area is greater than the width d2 of the opening on the side away from the display area. For example, the three-dimensional shape of the opening may be a trumpet shape.

In an embodiment of the present disclosure, the width d2 of the opening G on the side away from the display area D may be in a range of 8 μm to 12 μm, such as 8 μm, 10 μm, or 12 μm, and a specific width may be set according to actual needs. By setting the width of the opening in the above-mentioned range, it may be ensured that a siphon phenomenon occurs when the organic solution forming the organic material layer enters the opening G, so that the organic solution may enter the semi-closed region structure from the opening G due to the siphon phenomenon. In this way, the organic solution is confined within the semi-closed region structure, which is beneficial to reduction of the leveling region of the organic solution in the formation of the organic material layer.

The width d1 of the opening G on the side proximate to the display area is greater than the width d2 of the opening G on the side away from the display area. For example, the width d1 of the opening G on the side proximate to the display area may be greater than 12 μm, or in a range of 8 μm to 12 μm, as long as d1 is greater than d2.

According to an embodiment of the present disclosure, the opening G acts as a drainage port for the organic solution during the formation of the organic material layer 8 to allow the organic solution to enter the semi-closed region structure due to the siphon phenomenon of the opening G, so that the organic material layer 8 is formed within the semi-closed region structure and the organic material layer 8 is prevented from going beyond the protection region of the first inorganic layer and the second inorganic layer. Moreover, constricting the leveling region of the organic solution during the formation of the organic material layer is beneficial to the narrow bezel design of the display substrate.

In an embodiment of the present disclosure, at least one of the first sub-dam 21, the second sub-dam 22, or the third sub-dam 23 is provided with a stepped structure. By providing the stepped structure(s) on the sub-dam(s), a wetting rate and a spreading rate of the organic solution during the formation of the organic material layer may be increased.

In an embodiment of the present disclosure, a stepped structure of the first sub-dam 21 is provided on a side of the first sub-dam facing the display area; and/or a stepped structure of the second sub-dam 22 is provided on a side of the second sub-dam facing the display area.

Figure 7:
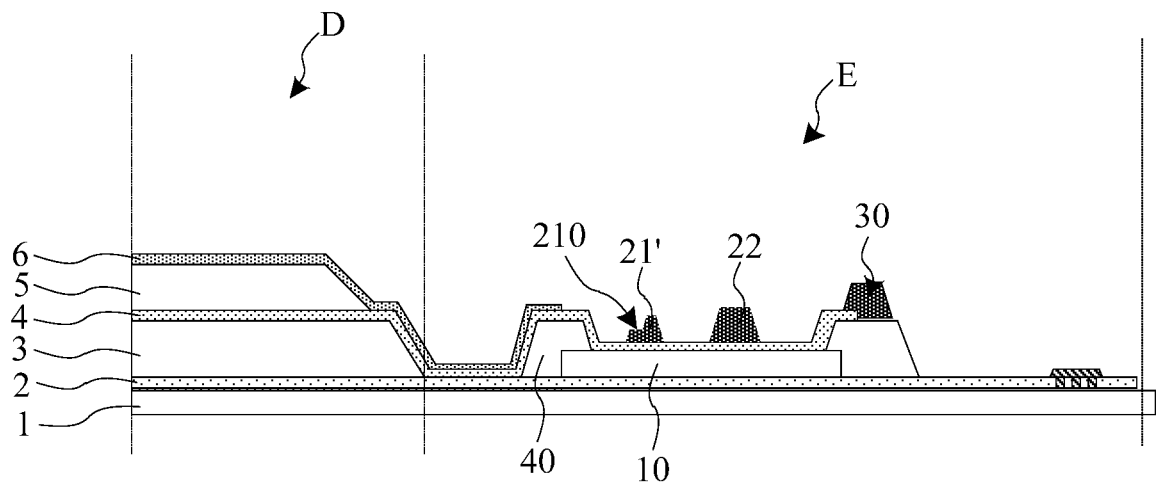
FIG. 7 shows a schematic diagram of a sectional structure of a display substrate without an encapsulation layer, taken along line AA' in FIG. 1, according to some exemplary embodiments of the present disclosure.
Figure 8:
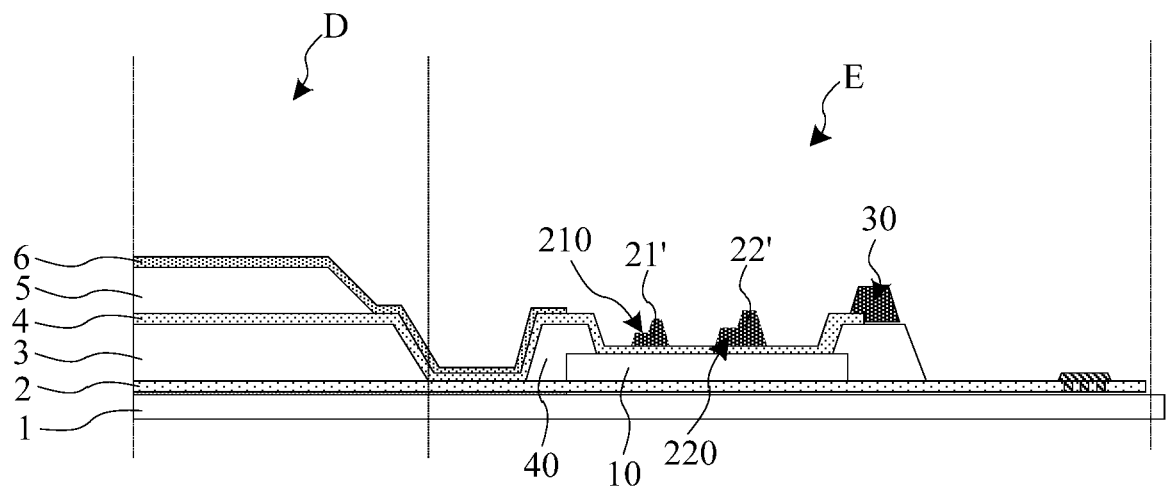
FIG. 8 shows a schematic diagram of a sectional structure of a display substrate without an encapsulation layer, taken along line AA' in FIG. 1, according to some other exemplary embodiments of the present disclosure.

FIG. 7 shows a schematic diagram of a sectional structure of a display substrate without an encapsulation layer, taken along line AA' in FIG. 1, according to some exemplary embodiments of the present disclosure. FIG. 8 shows a schematic diagram of a sectional structure of a display substrate without an encapsulation layer, taken along line AA' in FIG. 1, according to some other exemplary embodiments of the present disclosure.

As shown in FIG. 7, a stepped structure 210 is provided on a side of a first sub-dam 21' facing the display area D. The wetting or spread of the organic solution forming the organic material layer may be accelerated after the organic solution comes into contact with the stepped structure of the first sub-dam 21'. For example, by forming the stepped structure 210 on the first sub-dam 21', the organic solution spreads acceleratively along a lengthwise direction of the first sub-dam 21', and the organic solution enters the semi-closed region structure through the opening after spreading to the position of the opening G, so that a liquid level of the organic solution may be effectively reduced.

As shown in FIG. 8, stepped structures 210 and 220 are respectively provided on the side of the first sub-dam 21' facing the display area D and a side of a second sub-dam 22' facing the display area D.

For example, by forming the stepped structure 220 on the second sub-dam 22', the organic solution may spread acceleratively along a lengthwise direction of the second sub-dam 22' after entering the semi-closed region structure. On the one hand, the liquid level of the organic solution may be reduced, and on the other hand, the organic solution entering the semi-closed region structure may spread more uniformly, so that the formed organic material layer may have a more uniform size.

Figure 9:
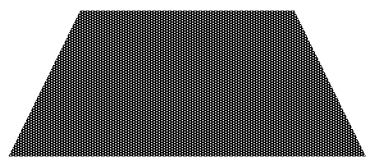
FIG. 9 shows a schematic diagram of a sectional structure of a third sub-dam of a display substrate taken along line C-C' in FIG. 5, according to some exemplary embodiments of the present disclosure.
Figure 10:
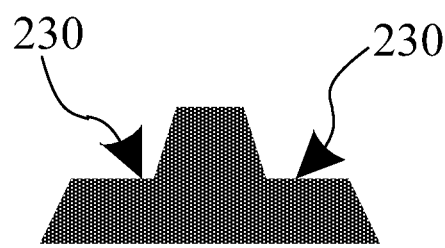
FIG. 10 shows a schematic diagram of a sectional structure of a third sub-dam of a display substrate taken along line C-C' in FIG. 5, according to some other exemplary embodiments of the present disclosure.

FIG. 9 shows a schematic diagram of a sectional structure of a third sub-dam of a display substrate taken along line C-C' in FIG. 5, according to some exemplary embodiments of the present disclosure. FIG. 10 shows a schematic diagram of a sectional structure of a third sub-dam of a display substrate taken along line C-C' in FIG. 5, according to some other exemplary embodiments of the present disclosure.

The third sub-dam 23 in FIG. 9 is not provided with a stepped structure. A third sub-dam 23' in FIG. 10 is provided with step structures 230 on both sides along a lengthwise direction of the third sub-dam 23', which may facilitate the wetting and spread of the organic solution entering the semi-closed region structure.

In an embodiment of the present disclosure, the number of steps on the stepped structure may be one or more, such as three, five, etc., which may be adjusted according to actual production needs and processes.

Figure 11:
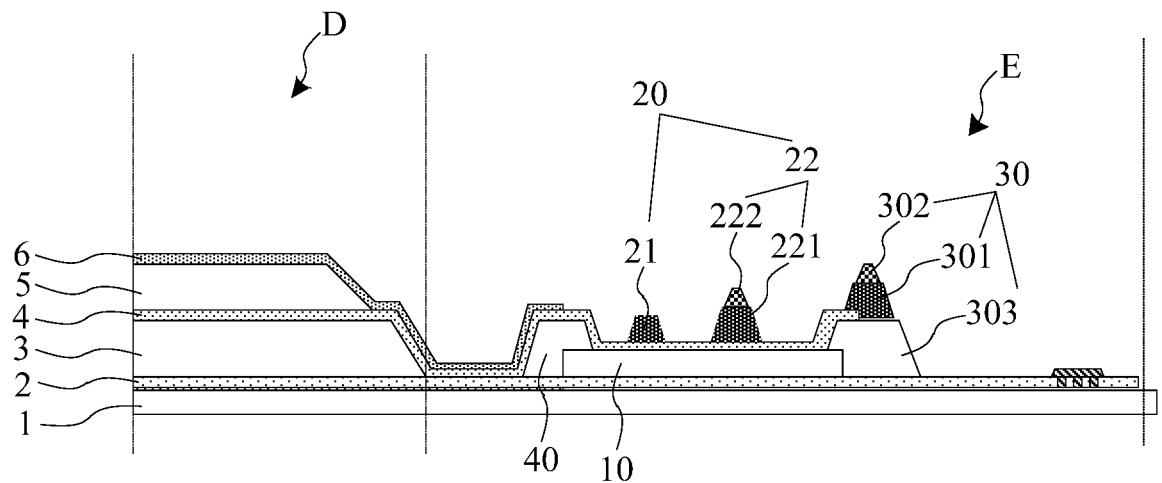
FIG. 11 shows a schematic diagram of a sectional structure of a display substrate without an encapsulation layer, taken along line AA' in FIG. 1, according to some other exemplary embodiments of the present disclosure.
Figure 12:
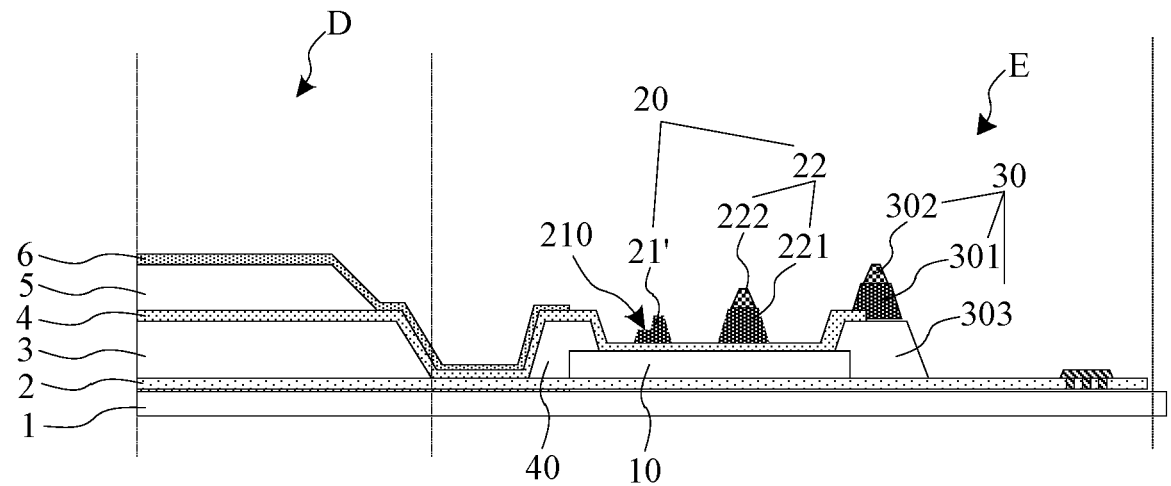
FIG. 12 shows a schematic diagram of a sectional structure of a display substrate without an encapsulation layer, taken along line AA' in FIG. 1, according to some other exemplary embodiments of the present disclosure.

FIG. 11 shows a schematic diagram of a sectional structure of a display substrate without the encapsulation layer, taken along line AA' in FIG. 1, according to some other exemplary embodiments of the present disclosure. FIG. 12 shows a schematic diagram of a sectional structure of a display substrate without the encapsulation layer, taken along line AA' in FIG. 1, according to some other exemplary embodiments of the present disclosure.

In an embodiment of the present disclosure, the first dam and the second dam include a first material layer, and each of the first dam and the second dam includes a first part. The first part of the first dam and the first part of the second dam are located in the first material layer. The first dam and the second dam further include a second material layer, and each of the first dam and the second dam further includes a second part. The second part of the second sub-dam and the second part of the second dam are located in the second material layer.

For example, as shown in FIG. 11 and FIG. 12, each of the first dam 20 and the second dam 30 includes a first part proximate to the substrate 1 and a second part arranged on a side of the first part away from the substrate 1. The first part is located in the lower first material layer, and the second part is located in the upper second material layer.

Specifically, as shown in FIG. 11 and FIG. 12, the first sub-dam 21 only includes a first part located in the first material layer. The second sub-dam 22 includes a first part 221 and a second part 222, where the first part 221 is located in the first material layer, and the second part 222 is located in the second material layer. The second dam 30 includes a first part 301 and a second part 302, where the first part 301 is located in the first material layer, and the second part 302 is located in the second material layer.

As shown in FIG. 12, in the case where the second part of the second sub-dam 22 is arranged in the second material layer, the stepped structure 210 may be further provided on the first sub-dam 21', so that the organic solution forming the organic material layer may be better confined within the semi-closed region structure.

In an embodiment of the present disclosure, a pixel definition layer is formed of a material included in the first material layer, and a spacer is formed of a material included in the second material layer.

In an embodiment of the present disclosure, the second dam 30 further includes a third material layer 303, and a planarization layer is formed of a material included in the third material layer 303.

For example, the third material layer 303 is arranged on a lower side of the second dam 30 and proximate to the substrate 1, as shown in FIG. 11 and FIG. 12.

According to the embodiments of the present disclosure, by providing the second dam, paths of the first inorganic layer and the second inorganic layer of the encapsulation layer may be extended, and the power line 10 may be covered. A width of the second dam is set in a range of 40 μm to 100 μm.

In an embodiment of the present disclosure, a structure of the second dam may also adopt the structure of the first dam described above, so as to achieve a precise control of the boundary of the formed organic material layer. The first dam and the second dam may be formed by one or more layers of a planarization layer, a pixel definition layer, and an isolation column layer.

In an embodiment of the present disclosure, as shown in FIG. 2, a third dam 40 surrounding the display area D is further provided on the side of the first dam 20 proximate to the display area D. The planarization layer is formed of a material included in the third dam 40.

In an embodiment of the present disclosure, the first dam 20, the second dam 30, and the third dam 40 are arranged on a side of the substrate 1, for example, on an upper side of the substrate 1. The display substrate further includes the power line 10 arranged between the substrate 1 and the dams (including the first dam 20, the second dam 30, and the third dam 40). The power line 10 may be made of, for example, a material of a source/drain metal layer. An orthographic projection of the first dam 20 on the substrate 1 overlaps with an orthographic projection of the power line 10 on the substrate 1.

Figure 13:
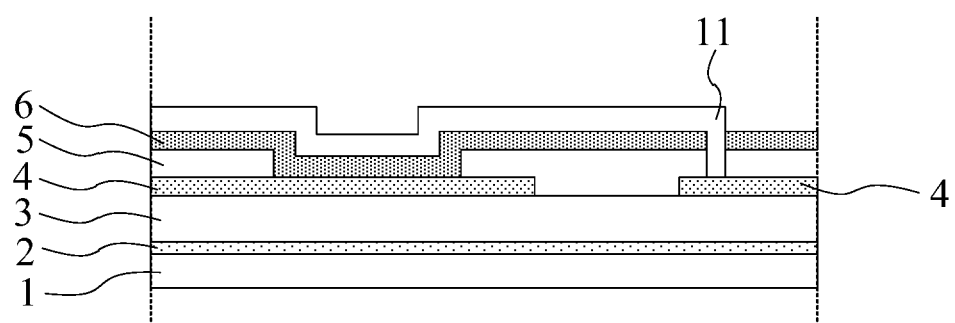
FIG. 13 shows a schematic diagram of an electrical connection between an anode transfer layer and a cathode in a display substrate, according to exemplary embodiments of the present disclosure.

FIG. 13 shows a schematic diagram of an electrical connection between an anode transfer layer and a cathode in a display substrate, according to exemplary embodiments of the present disclosure.

In embodiments of the present disclosure, the display substrate further includes an anode transfer layer 4 arranged between the power line 10 and the dams (including the first dam 20, the second dam 30, and the third dam 40). The display substrate further includes a cathode 11 arranged on a side of the light emitting layer 6 away from the substrate. The anode transfer layer 4 is electrically connected to the power line 10 and the cathode 11.

For example, one end of the anode transfer layer 4, which is in a projection region of the dams, is electrically connected to the power line 10, as shown in FIG. 2. Another end of the anode transfer layer 4, which is away from the region of the dams, is electrically connected to the cathode 11, as shown in FIG. 13.

Some exemplary embodiments of the present disclosure further provide a display apparatus including the display substrate as described above. The display apparatus may be any apparatus or product with a display function. For example, the display apparatus may be a smart phone, a mobile phone, an e-book reader, a desktop personal computer (PC), a laptop PC, a netbook PC, a personal digital assistant (PDA), a portable multimedia player (PMP), a digital audio player, a mobile medical apparatus, a camera, a wearable apparatus (such as a head-mounted device, electronic clothing, electronic bracelet, electronic necklace, electronic accessory, electronic tattoo, or smart watch), a television, etc.

According to an embodiment of the present disclosure, a manufacturing process for the display substrate is as follows.

Firstly, a substrate is manufactured. The substrate may be made of a glass material or a flexible material. The flexible material includes polyimide, PEN, PET, and the like. A flexible substrate may be a single-layer structure or a multi-layer structure. In the multi-layer structure, a buffer layer may be added between layers. The buffer layer is an inorganic thin film, which may be SiNx, SiOx, or a composite layer.

Then, a thin film transistor structure is manufactured on the substrate. Specifically, a buffer layer, a patterned active layer, a first insulation layer, a first gate electrode, a second gate electrode, a second insulation layer, a capacitor electrode, a third insulation layer, a drain electrode, a source electrode, and a planarization layer are formed on the substrate.

Then, an anode pattern, a pixel definition layer, a support column structure, a dam structure, and the like are fabricated on the planarization layer. The pixel definition layer, the support column, and the dam are made of a material the same as the material of the planarization layer, which may be, for example, an organic insulation material that may be made of polyimide photoresist. The isolation column is mainly arranged in the display area, and the dam structure (including the first dam and the second dam) is located in the non-display area.

Next, an organic light emitting layer and a cathode are formed on a back plate by using a vacuum evaporation process. The organic light emitting layer includes but is not limited to a hole injection layer, a hole transport layer, a light emitting layer, an electron transport layer, and the like.

Finally, an encapsulation layer is formed, which may include, for example, an inorganic layer for blocking water and oxygen and an organic material layer for stress release and planarization. The inorganic layer is manufactured by chemical vapor deposition or atomic layer deposition, and a material of the inorganic layer may be silicon nitride, silicon oxide, silicon oxynitride, aluminum oxide, titanium oxide, and the like. The organic material layer is prepared by inkjet printing, screen printing, dispensing, or other methods. Specifically, a first inorganic layer is deposited on the OLED device, and the first inorganic layer may be of one of the above-mentioned materials or a combination of some of the above-mentioned materials which are alternately stacked. The protection region of the inorganic layer has an area larger than that of the AA region used for display. Generally speaking, an orthographic projection of a coverage area is outside the dams. An organic material layer is prepared on the first inorganic layer. A coverage area of the organic material layer is less than that of the first inorganic layer, and an orthographic projection of the coverage area is at least larger than that of the cathode. A second inorganic layer is manufactured on the organic material layer. A manufacturing method and material of the second inorganic layer are the same as those of the first inorganic layer, and a coverage region of the second inorganic layer may be the same as or larger than that of the first inorganic layer. Similarly, the second inorganic layer may include one inorganic material or a combination of the above-mentioned inorganic layer materials.

Although some embodiments of a general technical concept of the present disclosure have been illustrated and described, it should be understood by those ordinary skilled in the art that these embodiments may be changed without departing from the principle and spirit of the general technical concept of the present disclosure. The scope of the present disclosure is defined by the claims and their equivalents.

What is claimed is:

1. A display substrate comprising a display area and a non-display area around the display area, comprising:
    a substrate;
    a light emitting layer arranged on a side of the substrate;
    an encapsulation layer arranged on a side of the light emitting layer away from the substrate and configured to encapsulate the light emitting layer; and
    at least two dams arranged around the display area in the non-display area, wherein
    the encapsulation layer comprises an organic material layer; and
    the dams comprise a first dam arranged around the display area and a second dam arranged around the first dam, wherein the first dam comprises a first sub-dam arranged discontinuously, a second sub-dam arranged continuously, and at least one third sub-dam connecting the first sub-dam and the second sub-dam;
    the first sub-dam, the second sub-dam, and the third sub-dam are arranged around to form at least one semi-closed region structure; and
    at least a part of the organic material layer is located in the semi-closed region structure.

2. The display substrate according to claim 1, wherein the semi-closed region structure has an opening facing the display area; and
    at least a part of the organic material layer is located in the opening.

3. The display substrate according to claim 2, wherein a width of the opening on a side proximate to the display area is greater than a width of the opening on a side away from the display area.

4. The display substrate according to claim 3, wherein the width of the opening on the side away from the display area is in a range of 8 µm to 12 µm.

5. The display substrate according to claim 1, wherein a width of the first sub-dam, a width of the second sub-dam, and a width of the third sub-dam are in a range of 20 µm to 80 µm.

6. The display substrate according to claim 1, wherein a height of the first sub-dam is less than or equal to a height of the second sub-dam; and
    a height of the third sub-dam is less than or equal to the height of the first sub-dam.

7. The display substrate according to claim 6, wherein the height of the first sub-dam, the height of the second sub-dam, and the height of the third sub-dam are in a range of 0.5 µm to 2 µm.

8. The display substrate according to claim 1, wherein two or more third sub-dams are provided, and a distance between adjacent third sub-dams is in a range of 5 mm to 15 mm.

9. The display substrate according to claim 1, wherein at least one of the first sub-dam, the second sub-dam, or the third sub-dam is provided with a stepped structure.

10. The display substrate according to claim 9, wherein a stepped structure of the first sub-dam is arranged on a side surface of the first sub-dam facing the display area; and/or
    a stepped structure of the second sub-dam is arranged on a side surface of the second sub-dam facing the display area.

11. The display substrate according to claim 1, wherein the first dam and the second dam comprise a first material layer, and each of the first dam and the second dam comprises a first part; and
    the first part of the first dam and the first part of the second dam are located in the first material layer.

12. The display substrate according to claim 11, wherein the first dam and the second dam further comprise a second material layer, and each of the first dam and the second dam further comprises a second part; and
    the second part of the second sub-dam and the second part of the second dam are located in the second material layer.

13. The display substrate according to claim 12, wherein a pixel definition layer is formed of a material included in the first material layer, and a spacer is formed of a material included in the second material layer.

14. The display substrate according to claim 13, wherein the second dam further comprises a third material layer, and a planarization layer is formed of a material included in the third material layer.

15. The display substrate according to claim 1, wherein a third dam around the display area is further provided on a side of the first dam proximate to the display area, and a planarization layer is formed of a material included in the third dam.

16. The display substrate according to claim 1, wherein the at least two dams are arranged on a side of the substrate;
    the display substrate further comprises a power line arranged between the substrate and the at least two dams; and
    an orthographic projection of the first dam on the substrate overlaps with an orthographic projection of the power line on the substrate.

17. The display substrate according to claim 16, wherein the display substrate further comprises an anode transfer layer arranged between the power line and the at least two dams;
    the display substrate further comprises a cathode arranged on the side of the light emitting layer away from the substrate; and
    the anode transfer layer is electrically connected to the power line and the cathode.

18. A display apparatus, comprising the display substrate according to claim 1.

* * * * *